(12) United States Patent
Koike et al.

(10) Patent No.: US 11,984,313 B2
(45) Date of Patent: May 14, 2024

(54) SEMICONDUCTOR WAFER, MANUFACTURING METHOD FOR SEMICONDUCTOR WAFER, AND MANUFACTURING METHOD FOR SEMICONDUCTOR DEVICE

(71) Applicant: Kioxia Corporation, Tokyo (JP)

(72) Inventors: Takashi Koike, Yokkaichi (JP); Manabu Takakuwa, Tsu (JP)

(73) Assignee: Kioxia Corporation, Tokyo (JP)

(*) Notice: Subject to any disclaimer, the term of this patent is extended or adjusted under 35 U.S.C. 154(b) by 0 days.

(21) Appl. No.: 17/706,176

(22) Filed: Mar. 28, 2022

(65) Prior Publication Data

US 2022/0216051 A1    Jul. 7, 2022

Related U.S. Application Data

(62) Division of application No. 16/792,944, filed on Feb. 18, 2020, now abandoned.

(30) Foreign Application Priority Data

Sep. 4, 2019   (JP) .................... 2019-161278

(51) Int. Cl.
   *H01L 21/02*   (2006.01)
   *H01L 23/00*   (2006.01)

(52) U.S. Cl.
   CPC ...... *H01L 21/02035* (2013.01); *H01L 23/562* (2013.01)

(58) Field of Classification Search
   CPC ............ H01L 21/02035; H01L 23/562; H01L 21/0274; H01L 21/6875; H01L 29/0657; H01L 29/0603; H01L 21/67069; H01L 21/67017; H01L 21/67288; H01L 21/205
   See application file for complete search history.

(56) References Cited

U.S. PATENT DOCUMENTS

| | | | |
|---|---|---|---|
| 7,705,430 B2 | 4/2010 | Sekiya | |
| 2001/0001953 A1* | 5/2001 | Griffiths | H01L 21/68757 118/500 |
| 2004/0195657 A1 | 10/2004 | Miyashita et al. | |
| 2010/0212833 A1* | 8/2010 | Chang | H01J 37/32642 156/345.43 |
| 2013/0217185 A1* | 8/2013 | Wisotzki | H01L 21/304 257/E21.599 |

(Continued)

FOREIGN PATENT DOCUMENTS

| | | |
|---|---|---|
| JP | 2004-022677 A | 1/2004 |
| JP | 2004-281951 A | 10/2004 |

(Continued)

*Primary Examiner* — Cuong B Nguyen
(74) *Attorney, Agent, or Firm* — Oblon, McClelland, Maier & Neustadt, L.L.P.

(57) ABSTRACT

A semiconductor wafer according to an embodiment includes a support region facing a support member, an outer circumferential region positioned on an outer side of the support region, and an inner circumferential region positioned on an inner side of the support region. The outer circumferential region has a convex portion with a thickness protruded upward with respect to the inner circumferential region or a concave portion with a thickness recessed downward with respect to the inner circumferential region.

6 Claims, 5 Drawing Sheets

(56) References Cited

U.S. PATENT DOCUMENTS

| | | | |
|---|---|---|---|
| 2015/0024606 A1* | 1/2015 | Hwang | H01L 21/6708 156/345.3 |
| 2015/0079701 A1 | 3/2015 | Yamashita | |
| 2016/0049355 A1 | 2/2016 | Howard | |
| 2018/0096952 A1 | 4/2018 | Miccoli | |
| 2019/0096777 A1 | 3/2019 | Seddon et al. | |

FOREIGN PATENT DOCUMENTS

| | | |
|---|---|---|
| JP | 2009-277805 A | 11/2009 |
| JP | 2013-165287 A | 8/2013 |
| JP | 5266869 B2 | 8/2013 |
| JP | 5569392 B2 | 8/2014 |

\* cited by examiner

SEMICONDUCTOR WAFER, MANUFACTURING METHOD FOR SEMICONDUCTOR WAFER, AND MANUFACTURING METHOD FOR SEMICONDUCTOR DEVICE

CROSS-REFERENCE TO RELATED APPLICATIONS

This application is a divisional of U.S. application Ser. No. 16/792,944, filed Feb. 18, 2020, the entire contents of which is incorporated herein by reference. U.S. application Ser. No. 16/792,944 is based upon and claims the benefit of priority from Japanese Patent Application No, 2019-161278, filed on Sep. 4, 2019; the entire contents of which are incorporated herein by reference.

FIELD

Embodiments of the present invention relate to a semiconductor wafer, a manufacturing method for a semiconductor wafer, and a manufacturing method for a semiconductor device.

BACKGROUND

Processes such as exposure, film formation, and etching are performed to a semiconductor wafer when a semiconductor device is manufactured. At this time, the semiconductor wafer is adsorbed in a state of being supported by a support member to keep a horizontal attitude.

When a semiconductor wafer is adsorbed in a state of being supported by a support member, an outside region of the semiconductor wafer positioned on an outer side of the support region bends in some cases.

DETAILED DESCRIPTION

Embodiments will now be explained with reference to the accompanying drawings. The present invention is not limited to the embodiments.

A semiconductor wafer according to an embodiment includes a support region facing a support member, an outer circumferential region positioned on an outer side of the support region, and an inner circumferential region positioned on an inner side of the support region. The outer circumferential region has a convex portion with a thickness protruded upward with respect to the inner circumferential region or a concave portion with a thickness recessed downward with respect to the inner circumferential region.

First Embodiment

Figure 1:
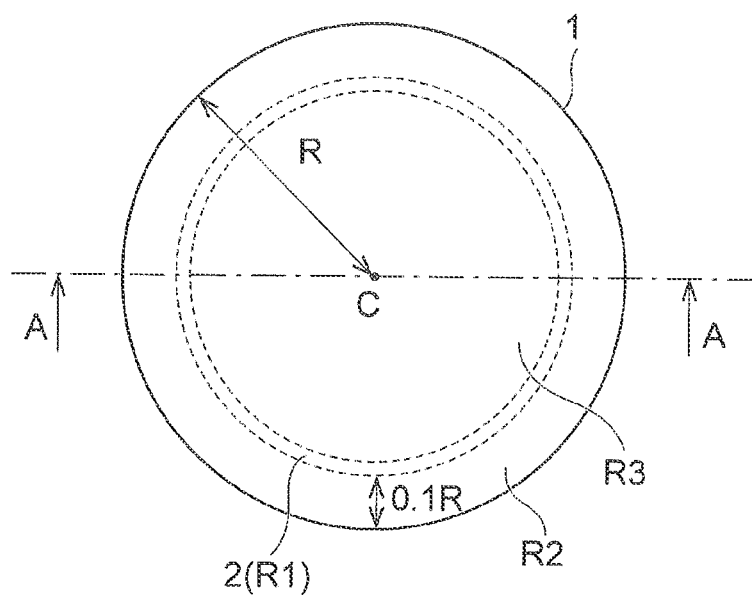
FIG. 1 is a plan view of a semiconductor wafer according to a first embodiment.
Figure 2:
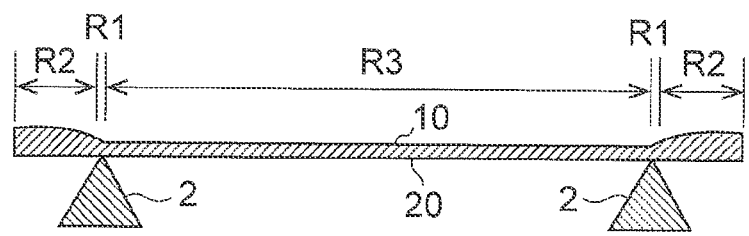
FIG. 2 is a sectional view along a section line A-A illustrated in FIG. 1.
Figure 3:
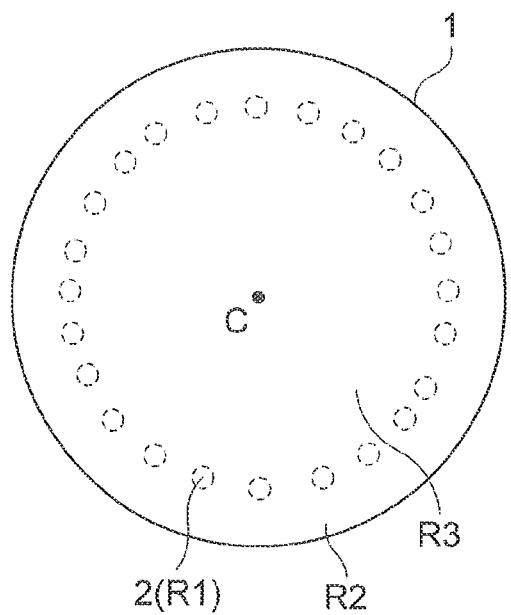
FIG. 3 is a plan view illustrating a modification of a support member.

FIG. 1 is a plan view of a semiconductor wafer according to a first embodiment. FIG. 2 is a sectional view along a section line A-A illustrated in FIG. 1. FIG. 3 is a plan view illustrating a modification of a support member.

A semiconductor wafer 1 according to the present embodiment includes a first surface 10 and a second surface 20. Processes such as exposure, film formation, and etching are performed to the first surface 10, The second surface 20 is in contact with a support member 2 as illustrated in FIG. 2. The first surface 10 and the second surface 20 include a support region R1, an outer circumferential region R2, and an inner circumferential region R3.

The support member 2 has a shape of a ring continuously surrounding the inner circumferential region R3 along the circumferential direction of the semiconductor wafer 1. The support member 2 may have a shape of pins dotted to intermittently surround the inner circumferential region R3 along the circumferential direction as illustrated in FIG. 3.

The support region R1 is a region facing the support member 2 in the vertical direction. The outer circumferential region R2 is a region positioned on the outer side of the support region R1. The inner circumferential region R3 is a region positioned on the inner side of the support region R1 and including a center C of the semiconductor wafer 1.

In the present embodiment, the outer circumferential region R2 of the semiconductor wafer 1 has a convex portion with a thickness protruded upward with respect to the inner circumferential region R3 as illustrated in FIG. 2. The outer circumferential region R2 is, for example, a region on an outer side than 0.9R where the radius of the semiconductor wafer 1 is R, in other words, a region where the distance from the outer circumferential end of the semiconductor wafer 1 is 0.1R.

A manufacturing method for the semiconductor wafer 1 described above is explained below with reference to FIGS. 4A and 43.

Figure 4A:
FIG. 4A is an explanatory diagram of a manufacturing method for a semiconductor wafer.
Figure 4B:
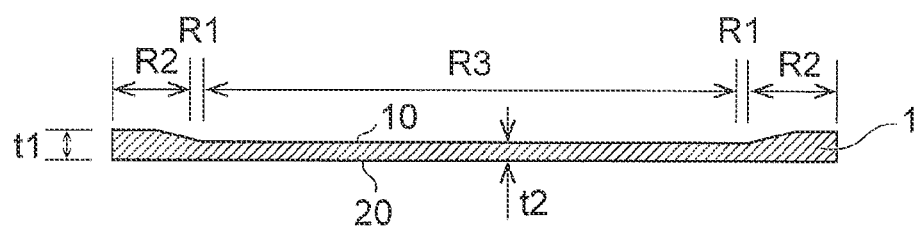
FIG. 4B is an explanatory diagram of the manufacturing method for a semiconductor wafer.

First, a semiconductor wafer 1a is formed as illustrated in FIG. 4A. A thickness t1 of the semiconductor wafer 1a is constant in the entire region. Next, a region corresponding to the support region R1 and the inner circumferential region R3 described above of the semiconductor wafer 1a is ground by, for example, chemical mechanical polishing (CMP) or etching until the region has a thickness t2 (<t1) as illustrated in FIG. 4B. As a result, the outer circumferential region R2 becomes a convex portion with the thickness protruded upward with respect to the inner circumferential region R3, whereby the semiconductor wafer 1 according to the present embodiment is completed. A semiconductor device can be manufactured by performing exposure and film formation to this semiconductor wafer 1. The semiconductor device includes, for example, a three-dimensional semiconductor memory where electrode layers (word lines) are stacked.

Figure 5:
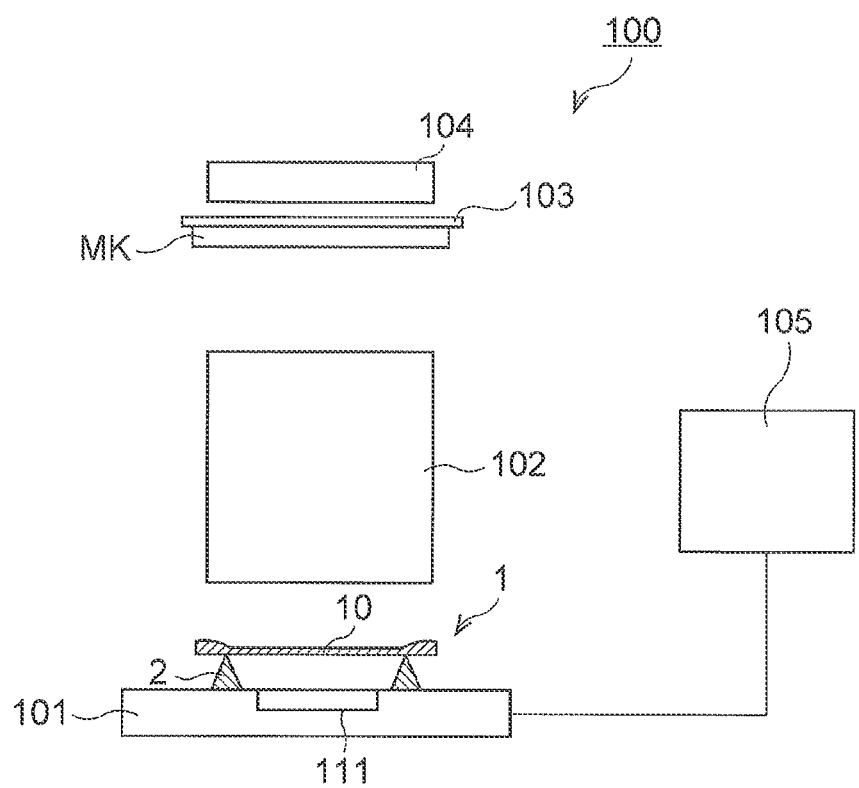
FIG. 5 is a schematic diagram of a substrate processing apparatus that exposes a semiconductor wafer to light.

An exposure step for the semiconductor wafer 1 according to the present embodiment is explained below with reference to FIG. 5. FIG. 5 is a schematic diagram of a substrate processing apparatus that exposes the semiconductor wafer 1 according to the present embodiment to light.

A substrate processing apparatus 100 illustrated in FIG. 5 includes a substrate stage 101, a projector 102, a mask stage 103, a light source 104, and a controller 105, The substrate processing apparatus 100 is, for example, a scanning exposure apparatus that performs projection exposure of a pattern drawn on a mask MK onto the semiconductor wafer 1 being an exposure target while synchronously moving the mask MK and the semiconductor wafer 1 with respect to each other in a scanning direction.

The substrate stage 101 holds the semiconductor wafer 1 via the support member 2. A chuck part 111 is provided on the substrate stage 101. The chuck part 111 causes the semiconductor wafer 1 to be adsorbed to the substrate stage 101 with, for example, static electricity or vacuum. The substrate stage 101 is capable of horizontally moving or rotationally moving on the basis of control of the controller 105.

The projector 102 is provided above the substrate stage 101. The mask stage 103 holding the mask MK is provided above the projector 102. The light source 104 is provided above the mask stage 103.

In the substrate processing apparatus 100, exposure light emitted from the light source 104 is diffracted by the pattern drawn on the mask MK and enters the projector 102. The projector 102 performs projection exposure of the first surface 10 of the semiconductor wafer 1 to the incident light. Accordingly, the pattern on the mask MK is transferred to the first surface 10.

Figure 6:
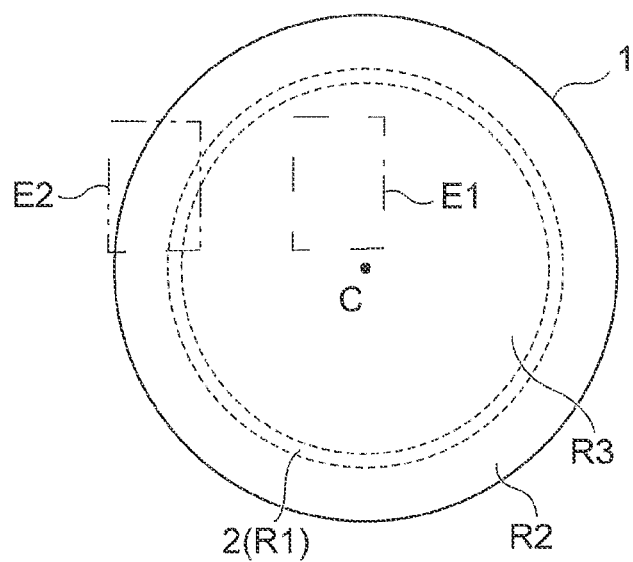
FIG. 6 is a plan a view illustrating an exposure pattern region on the semiconductor wafer.

FIG. 6 is a plan a view illustrating an exposure pattern region on the semiconductor wafer. The substrate processing apparatus 100 performs the exposure processing with the semiconductor wafer 1 being divided into a plurality of exposure pattern regions. The exposure pattern regions of the substrate processing apparatus 100 include an exposure pattern region E1 that entirely falls within the semiconductor wafer 1 while including an exposure pattern region E2 that partially spreads out of the semiconductor wafer 1 as illustrated in FIG. 6.

A large part of the exposure pattern region E2 is occupied by the outer circumferential region R2 of the semiconductor wafer 1. At the time of exposure processing, the semiconductor wafer 1 is adsorbed to the substrate stage 101 by the chuck part 111 in a state of being supported by the support member 2 as described above. At this time, if the thicknesses of the support region R1, the outer circumferential region R2, and the inner circumferential region R3 are all equal, the outer circumferential region R2 sometimes bends downward (hangs down) from a boundary portion with the support region R1 to be a curved surface while the inner circumferential region R3 is generally a flat surface. In this case, a desired focus accuracy is not obtained on the exposure pattern region E2 and an exposure failure is likely to occur.

In the present embodiment, the outer circumferential region R2 is processed into a convex portion with the thickness protruded upward with respect to the inner circumferential region R3. Accordingly, the outer circumferential region R2 is thicker than the inner circumferential region R3 and is therefore less likely to bend. The thickness t1 of the convex portion is set based on a largest bending amount of the outer circumferential region R2, which is supposed in a case where the respective thicknesses of the regions are equal. For example, when a radius R of the semiconductor wafer 1 is 150 millimeters (the diameter is 300 millimeters), the largest bending amount is generally not smaller than 10 nm and not larger than 10 μm. In this case, to suppress bending of the outer circumferential region R2, the thickness t1 of the convex portion is desirably larger than the thickness t2 by a thickness not smaller than 10 nm and not larger than 10 μm.

Figure 7:
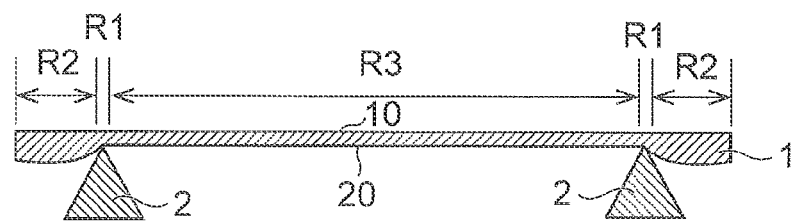
FIG. 7 is a sectional view of a semiconductor wafer according to a modification of the first embodiment.
Figure 8:
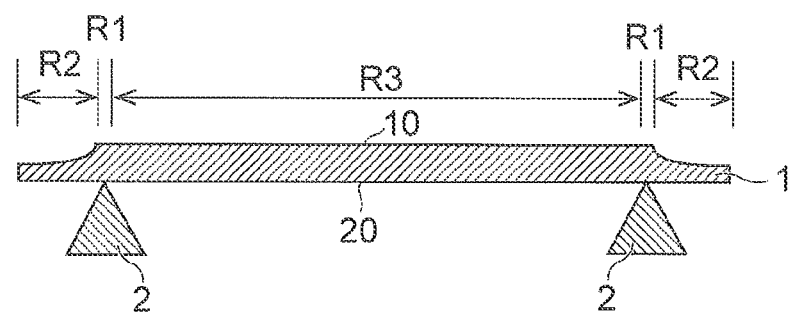
FIG. 8 is a sectional view of a semiconductor wafer according to another modification of the first embodiment.

Due to formation of the convex portion on the outer circumferential region R2 as described above, the semiconductor wafer 1 has a generally horizontal attitude when adsorbed in the state of being supported by the support member 2. Therefore, the focus accuracy of the exposure pattern region R2 is ensured. Accordingly, an exposure failure in the outer circumferential region R2 can be reduced, FIG. 7 is a sectional view of a semiconductor wafer according to a modification of the first embodiment. FIG. 8 is a sectional view of a semiconductor wafer according to another modification of the first embodiment.

In the embodiment described above, the first surface 10 of the outer circumferential region R2 is protruded assuming a situation in which the outer circumferential region R2 bends downward from the boundary portion with the support region R1 at the time of adsorption of the semiconductor wafer 1. However, a situation in which the outer circumferential region R2 bends upward (warps upward) at the time of adsorption of the semiconductor wafer 1 is also supposed. In this case, when the second surface 20 of the outer circumferential region R2 is protruded as illustrated in FIG. 7, deformation of the outer circumferential region R2 is suppressed and an exposure failure can be consequently reduced.

A concave portion having a thickness recessed downward with respect to the inner circumferential region R3 may be formed on the outer circumferential region R2 as illustrated in FIG. 8 in anticipation of deformation of the outer circumferential region R2, which is expected at the time of adsorption of the semiconductor wafer 1 in a case where the thicknesses of the respective regions are uniform.

Figure 9:
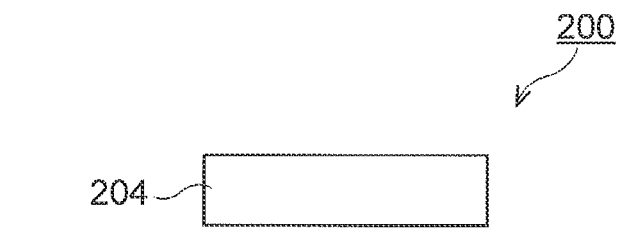
FIG. 9 is a schematic diagram of a substrate processing apparatus that performs film formation or etching of the semiconductor wafer.
Figure 9:
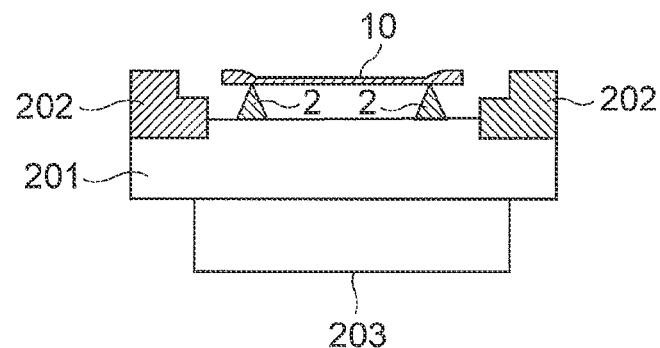

A film formation step and an etching step for the semiconductor wafer 1 according to the present embodiment are explained next with reference to FIG. 9. FIG. 9 is a schematic diagram of a substrate processing apparatus that performs film formation or etching of the semiconductor wafer 1 according to the present embodiment.

A substrate processing apparatus 200 illustrated in FIG. 9 includes an electrostatic chuck part 201, a focus ring 202, a lower electrode 203, and a head 204. The substrate processing apparatus 200 is, for example, a plasma CVD (Chemical Vapor Deposition) apparatus that forms a film on the semiconductor wafer 1 by CVD in a state where plasma is generated, or an etching apparatus that etches a film formed on the semiconductor wafer 1 by dry etching using plasma.

The electrostatic chuck part 201 holds the semiconductor wafer 1 via the support member 2. The focus ring 202 is placed on the top surface of the electrostatic chuck part 201. The electrostatic chuck part 201 causes the semiconductor wafer 1 and the focus ring 202 to be adsorbed thereto with static electricity.

The focus ring 202 is formed in an annular shape surrounding the semiconductor wafer 1. The focus ring 202 is placed to uniformly generate plasma between the center of the semiconductor wafer 1 and the outer circumference thereof.

The lower electrode 203 is provided on the bottom part of the electrostatic chuck part 201. The head 204 is provided above the electrostatic chuck part 201. Plasma is generated when a high-frequency electric field is generated between the lower electrode 203 and the head 204 by supply of power from a high-frequency power source (not illustrated). When plasma is generated, the head 204 ejects a film forming gas or an etching gas toward the first surface 10 of the semiconductor wafer 1.

In the substrate processing apparatus 200, plasma generation on the outer circumferential region R2 of the semiconductor wafer 1 is particularly adjusted by installation of the focus ring 202. However, if the outer circumferential region R2 bends at the time of adsorption by the electrostatic chuck part 201, the horizontal attitude cannot be maintained and thus the controllability of film formation or etching is degraded. As a result, a film formation failure or an etching failure is likely to occur.

However, in the semiconductor wafer 1 according to the present embodiment, the shape of the outer circumferential region R2 is optimized to enable the outer circumferential region R2 to keep the horizontal attitude at the time of adsorption by the electrostatic chuck part 201. Accordingly, the controllability of film formation or etching is improved and a film formation failure or an etching failure can be reduced.

Second Embodiment

Figure 10:
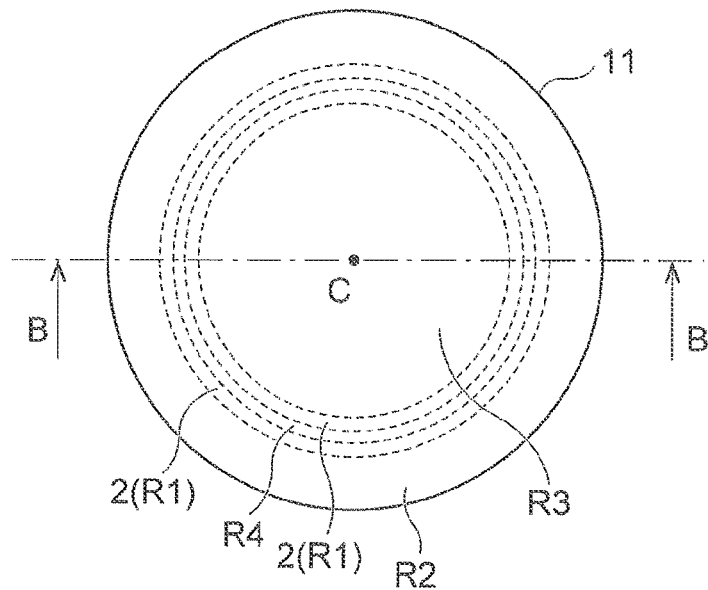
FIG. 10 is a plan view of a semiconductor wafer according to a second embodiment.
Figure 11:
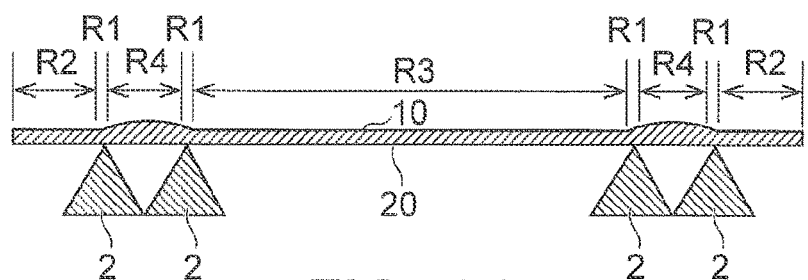
FIG. 11 is a sectional view along a section line B-B illustrated in FIG. 10.

FIG. 10 is a plan view of a semiconductor wafer according to a second embodiment. FIG. 11 is a sectional view along a section line B-B illustrated in FIG. 10. In FIG. 10 and FIG. 11, constituent elements identical to those in the first embodiment described above are denoted by like reference signs, and detailed explanations thereof are omitted.

As illustrated in FIGS. 10 and 11, a semiconductor wafer 11 according to the present embodiment is supported by the support member 2 having a ring shape continuously doubly surrounding the inner circumferential region R3 along the circumferential direction. In a case of this support mode, the semiconductor wafer 11 has an intermediate region R4 sandwiched by the support region R1 in addition to the support region R1, the outer circumferential region R2, and the inner circumferential region R3. The intermediate region R4 has a possibility of bending downward when adsorbed by the substrate processing apparatus 100 and the substrate processing apparatus 200 explained in the first embodiment. In this case, process failures such as an exposure failure, a film formation failure, and an etching failure are likely to occur on the intermediate region R4.

In the present embodiment, in order to solve this problem, a portion of the intermediate region R4 on the side of the first surface 10 is processed into a convex portion with the thickness protruded upward with respect to the outer circumferential region R2 and the inner circumferential region R3. Accordingly, the intermediate region R4 is thicker than the outer circumferential region R2 and the inner circumferential region R3 and is thus less likely to bend. As a result, the semiconductor wafer 11 has a generally horizontal attitude when adsorbed by the substrate processing apparatus 100 or the substrate processing apparatus 200 and process failures on the intermediate region R4 can be reduced.

Figure 12:
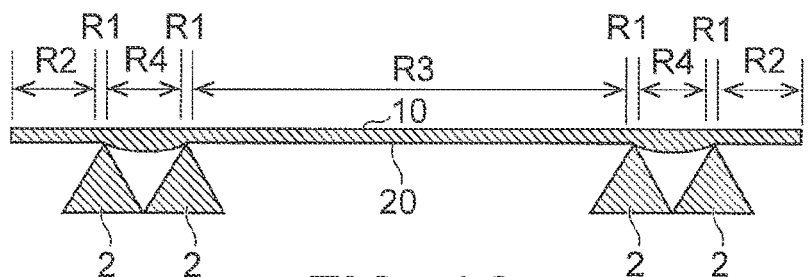
FIG. 12 is a sectional view of a semiconductor wafer according to a modification of the second embodiment.
Figure 13:
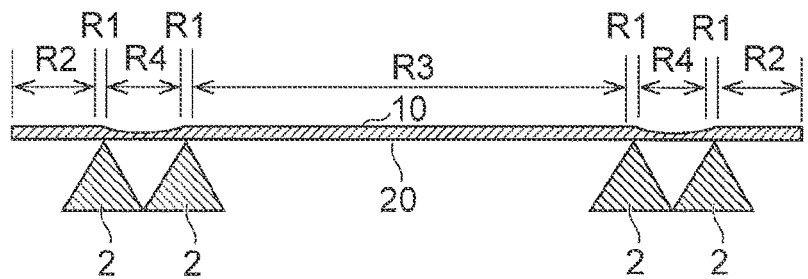
FIG. 13 is a sectional view of a semiconductor wafer according to another modification of the second embodiment.

FIG. 12 is a sectional view of a semiconductor wafer according to a modification of the second embodiment. FIG. 13 is a sectional view of a semiconductor wafer according to another modification of the second embodiment.

For example, in a case in which a situation where the outer circumferential region R2 bends upward (warps upward) at the time of adsorption of the semiconductor wafer 11 is supposed, deformation of the intermediate region R4 can be suppressed when a portion of the intermediate region R4 on the side of the second surface 20 is protruded as illustrated in FIG. 12. Consequently, process failures can be reduced. Further, a concave portion recessed downward with respect to the outer circumferential region R2 and the inner circumferential region R3 may be formed by grinding the intermediate region R4 as illustrated in FIG. 13 in anticipation of deformation of the intermediate region R4, which is expected at the time of adsorption of the semiconductor wafer 1 in a case where the thicknesses of the respective regions are uniform.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor wafer comprising:
   a support region facing a support member;
   an outer circumferential region positioned on an outer side of the support region; and
   an inner circumferential region positioned on an inner side of the support region, wherein
   the outer circumferential region has a convex portion with a thickness protruded upward with respect to the inner circumferential region or a concave portion with a thickness recessed downward with respect to the inner circumferential region,
   the support region has a shape of double rings,
   the wafer further comprises an intermediate region sandwiched by the support region, and
   the convex portion or the concave portion is provided on the intermediate region instead of the outer circumferential region.

2. A manufacturing method for a semiconductor wafer comprising a support region facing a support member, an outer circumferential region positioned on an outer side of the support region, and an inner circumferential region positioned on an inner side of the support region, wherein a shape of the support region is a double ring shape, and the semiconductor wafer further comprises an intermediate region sandwiched by the support region, the method comprising
   forming a convex portion with a thickness protruded upward or downward with respect to the inner circumferential region or a concave portion with a thickness recessed downward with respect to the inner circumferential region, on the intermediate outer circumferential region.

3. A manufacturing method for a semiconductor device with a semiconductor wafer including a support region, an outer circumferential region positioned on an outer side of the support region, and an inner circumferential region positioned on an inner side of the support region, wherein a shape of the support region is a double ring shape, and the semiconductor wafer further comprises an intermediate region sandwiched by the support region, the method comprising:
- supporting the semiconductor wafer with a support member provided at a back surface of the semiconductor wafer, the wafer comprising a convex portion with a thickness protruded upward or downward with respect to the inner circumferential region or a concave portion with a thickness recessed downward with respect to the inner circumferential region, the convex portion or the concave portion being formed on the intermediate region; and
- processing one of surfaces of the semiconductor wafer supported by the support met fiber.

4. The manufacturing method of claim 3, comprising performing exposure processing of the one surface of the semiconductor wafer, with the one surface divided into a plurality of exposure pattern regions.

5. The manufacturing method of claim 3, comprising ejecting a film forming gas or an etching gas toward the one surface of the semiconductor water in a state where plasma is generated above the one surface.

6. The manufacturing method of claim 3, wherein the support member has a shape of pins dotted to intermittently surround the inner circumferential region along a circumferential direction of the semiconductor wafer.

\* \* \* \* \*